(12) United States Patent
Liu et al.

(10) Patent No.: US 9,111,159 B2
(45) Date of Patent: Aug. 18, 2015

(54) IMAGING BASED BARCODE SCANNER ENGINE WITH MULTIPLE ELEMENTS SUPPORTED ON A COMMON PRINTED CIRCUIT BOARD

(75) Inventors: Yong Liu, Suzhou (CN); Xi Tao, Suzhou (CN); Ynjiun Paul Wang, Cupertino, CA (US)

(73) Assignee: Metrologic Instruments, Inc., Blackwood, NJ (US)

( * ) Notice: Subject to any disclaimer, the term of this patent is extended or adjusted under 35 U.S.C. 154(b) by 0 days.

(21) Appl. No.: 14/342,544

(22) PCT Filed: Sep. 9, 2011

(86) PCT No.: PCT/CN2011/001531
§ 371 (c)(1),
(2), (4) Date: Aug. 19, 2014

(87) PCT Pub. No.: WO2013/033867
PCT Pub. Date: Mar. 14, 2013

(65) Prior Publication Data
US 2014/0346233 A1 Nov. 27, 2014

(51) Int. Cl.
*G06K 7/10* (2006.01)
*G02B 26/08* (2006.01)

(52) U.S. Cl.
CPC .......... *G06K 7/10722* (2013.01); *G06K 7/1098* (2013.01); *G06K 7/10732* (2013.01); *G06K 7/10851* (2013.01)

(58) Field of Classification Search
CPC .......... G06K 7/10722; G06K 7/10732; G06K 7/10851; G06K 7/10821; G06K 7/1439; H04N 5/374

USPC .................................. 235/462.01–462.49
See application file for complete search history.

(56) References Cited

U.S. PATENT DOCUMENTS

| | | | |
|---|---|---|---|
| 2005/0011957 A1* | 1/2005 | Attia et al. | 235/462.46 |
| 2005/0092842 A1* | 5/2005 | Shimizu et al. | 235/462.33 |
| 2007/0292983 A1* | 12/2007 | Kriman et al. | 438/66 |
| 2009/0277963 A1* | 11/2009 | Van Kerkhoven et al. | 235/462.21 |
| 2010/0078477 A1* | 4/2010 | Wang et al. | 235/454 |
| 2010/0090007 A1* | 4/2010 | Wang et al. | 235/462.11 |

* cited by examiner

*Primary Examiner* — Laura Gudorf
(74) *Attorney, Agent, or Firm* — Additon, Higgins & Pendleton, P.A.

(57) ABSTRACT

An apparatus for use in decoding a bar code symbol may include an image sensor integrated circuit having a plurality of pixels, timing and control circuitry for controlling an image sensor, gain circuitry for controlling gain, and analog to digital conversion circuitry for conversion of an analog signal to a digital signal. The apparatus may also include a printed circuit board for receiving the image sensor integrated circuit. The connection between the image sensor integrated circuit and the printed circuit board characterized by a plurality of conductive adhesive connectors disposed between a plurality of electrode pads and a plurality of contact pads, where the conductive adhesive connectors provide electrical input/output and mechanical connections between the image sensor integrated circuit and the printed circuit board. The apparatus may be operative for processing image signals generated by the image sensor integrated circuit for attempting to decode the bar code symbol.

20 Claims, 4 Drawing Sheets

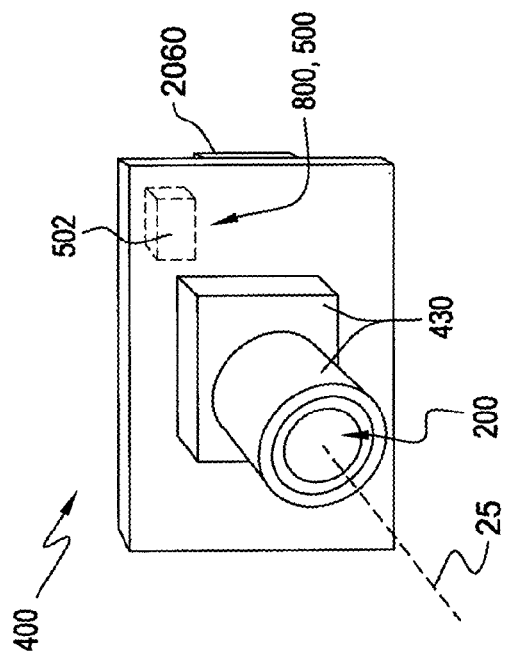
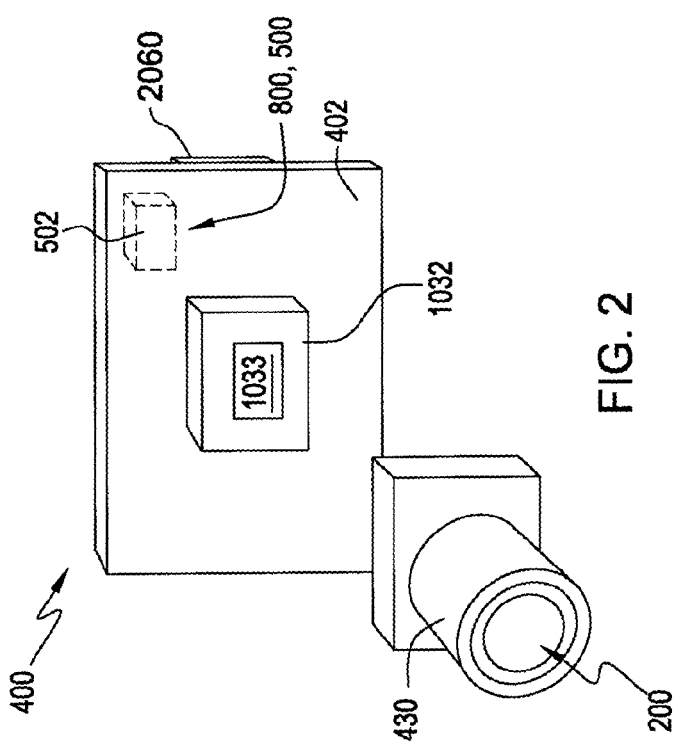

IMAGING BASED BARCODE SCANNER ENGINE WITH MULTIPLE ELEMENTS SUPPORTED ON A COMMON PRINTED CIRCUIT BOARD

FIELD OF THE INVENTION

The present invention relates, in general, to decoding of bar code symbols, and is particularly related to an apparatus for use in decoding a bar code symbol with multiple elements supported on a common printed circuit board.

BACKGROUND OF THE INVENTION

Indicia reading terminals for reading decodable indicia are available in multiple varieties. For example, minimally featured indicia reading terminals devoid of a keyboard and display are common in point of sale applications. Indicia reading terminals devoid of a keyboard and display are available in the recognizable gun style form factor having a handle and trigger button (trigger) that can be actuated by an index finger. Indicia reading terminals having keyboards and displays are also available. Keyboard and display equipped indicia reading terminals are commonly used in shipping and warehouse applications, and are available in form factors incorporating a display and keyboard. In a keyboard and display equipped indicia reading terminal, a trigger button for actuating the output of decoded messages is typically provided in such locations as to enable actuation by a thumb of an operator. Indicia reading terminals in a form devoid of a keyboard and display or in a keyboard and display equipped form are commonly used in a variety of data collection applications including point of sale applications, shipping applications, warehousing applications, security check point applications, and patient care applications, and personal use, common where keyboard and display equipped indicia reading terminal is provided by a personal mobile telephone having indicia reading functionality. Some indicia reading terminals are adapted to read bar code symbols including one or more of one dimensional (1D) bar codes, stacked 1D bar codes, and two dimensional (2D) bar codes. Other indicia reading terminals are adapted to read OCR characters while still other indicia reading terminals are equipped to read both bar code symbols and OCR characters.

BRIEF DESCRIPTION OF THE DRAWINGS

The features described herein can be better understood with reference to the drawings described below. The drawings are not necessarily to scale, emphasis instead generally being placed upon illustrating the principles of the invention. In the drawings, like numerals are used to indicate like parts throughout the various views.

FIG. 2 is an exploded assembly perspective view of an imaging module, in accordance with an aspect of the invention;

FIG. 3 is a perspective view of an imaging module, in accordance with an aspect of the invention;

SUMMARY OF THE INVENTION

Figure 1:
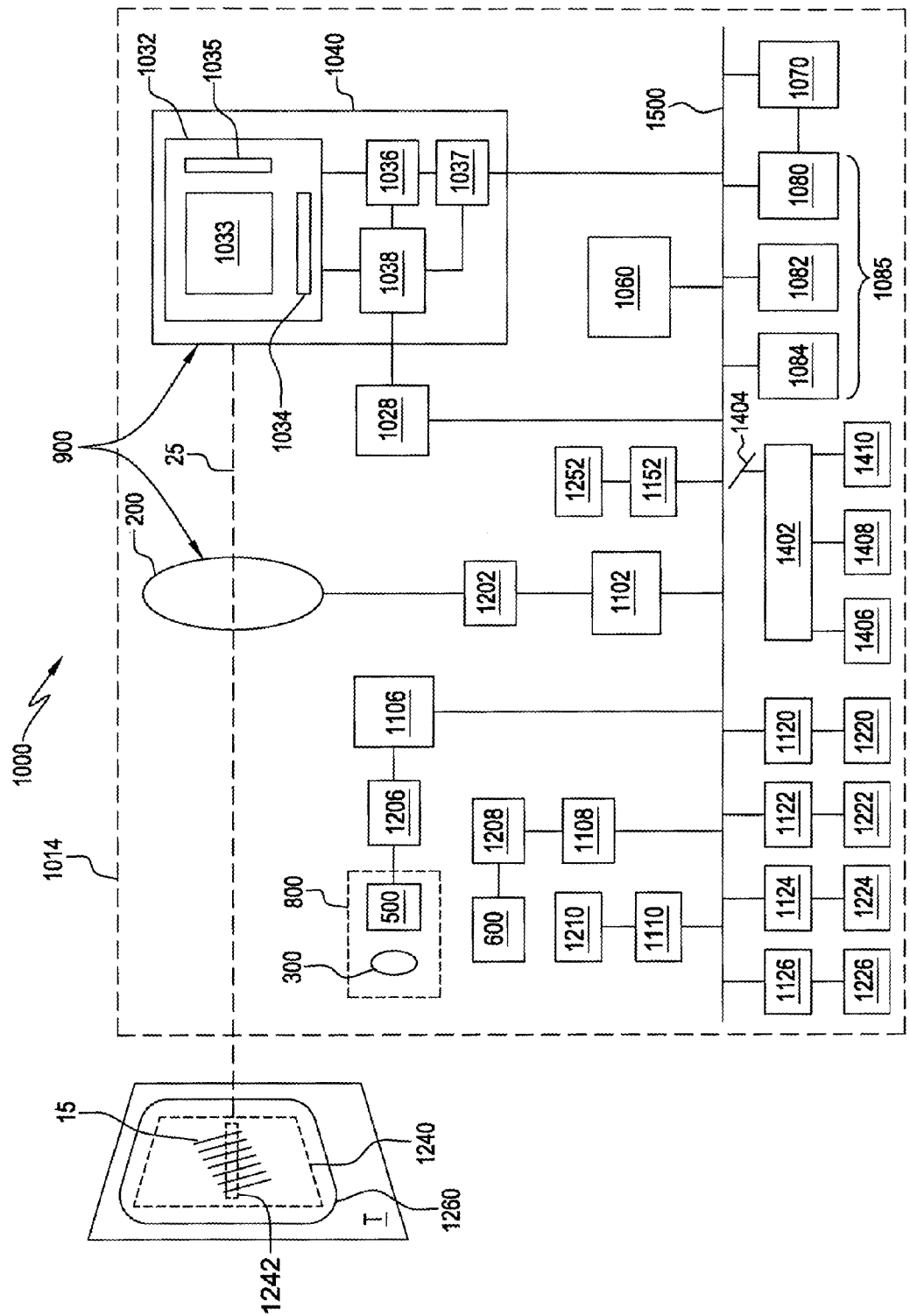
FIG. 1 is a block diagram of an apparatus for use in decoding a bar code symbol, the apparatus having multiple elements supported on a common printed circuit board, in accordance with an aspect of the invention.

According to one aspect, an invention for use in decoding a bar code symbol is provided. The apparatus may include an image sensor integrated circuit having a plurality of pixels arranged in a plurality of rows and columns of pixels, timing and control circuitry for controlling an image sensor, gain circuitry for controlling the gain of one or more signals, analog to digital conversion circuitry for conversion of an analog signal to a digital signal, and a plurality of electrode pads on a surface of the image sensor integrated circuit. The apparatus may also include a printed circuit board for receiving the image sensor integrated circuit and a plurality of contact pads disposed on a surface of the printed circuit board. The connection between the image sensor integrated circuit and the printed circuit board may be characterized by a plurality of conductive adhesive connectors disposed between the plurality of electrode pads on the surface of the image sensor integrated circuit and the plurality of contact pads disposed on the surface of the printed circuit board, where the conductive adhesive connectors provide electrical input/output and mechanical connections between the image sensor integrated circuit and the printed circuit board. The apparatus may be operative for processing image signals generated by the image sensor integrated circuit for attempting to decode the bar code symbol.

According to alternative aspects, the apparatus may further comprise a hand held housing encapsulating the image sensor integrated circuit. In another aspect, the apparatus may further comprise a light source bank positioned on the printed circuit board. In one aspect, the light source bank may be an LED. In a further aspect, the light source bank may be electrically connected to the printed circuit board. In another aspect, the apparatus may include an aimer light source bank positioned on the printed circuit board. The aimer light source bank may be an LED. The apparatus may include an aimer subsystem electrically connected to the printed circuit board. In another aspect, the processing of image signals generated by the image sensor integrated circuit for attempting to decode the bar code symbol may be performed by a circuit disposed on the printed circuit board. In an alternative aspect, the processing of image signals generated by the image sensor integrated circuit for attempting to decode the bar code symbol may be performed by a computer external to the housing. In another aspect, the processing of image signals generated by the image sensor integrated circuit for attempting to decode the bar code symbol may be performed within the housing. In another aspect, the processing of the image signal generated by the image sensor integrated circuit for attempting to decode the bar code symbol is performed by circuitry external to the housing.

DETAILED DESCRIPTION OF THE INVENTION

In traditional applications, barcode engines and other scanning devices have typically been disposed on multiple Printed Circuit Boards (PCBs). Multiple PCBs have been required because image based barcode scanners required a large number of component parts, including, but not limited to, an image sensor, a lens assembly, an illumination light source, an aimer light source, and/or a microcontroller some of which were large and/or bulky. Where additional PCBs are used, the costs and the risk of product failure due to potential connection problems between PCBs increase.

According to the present invention, more than one of the required parts for an imaging based barcode scanner engine may be disposed on a common PCB. The placement of component parts on a common PCB reduces the overall cost and risk of failure of the imaging based barcode scanner engine. In various embodiments, an image sensor integrated circuit including, for example, a camera module, an illumination light source, and/or an aimer light source may all be disposed on a single PCB. If desired, additional elements may be placed on a common PCB.

An exemplary hardware platform for support of operations described herein with reference to an apparatus 1000 for use in decoding a bar code symbol is shown and described with reference to FIG. 1.

Bar code decoding apparatus 1000 may include a housing 1014. Apparatus 1000 can include an image sensor 1032 comprising a multiple pixel image sensor array 1033 having pixels arranged in rows and columns of pixels, associated column circuitry 1034 and row circuitry 1035. Associated with the image sensor 1032 can be amplifier or gain circuitry 1036 (amplifier), and an analog to digital converter 1037 which converts image information in the form of analog signals read out of image sensor array 1033 into image information in the form of digital signals. Image sensor 1032 can also have an associated timing and control circuit 1038 for use in controlling e.g., the exposure period of image sensor 1032, gain applied to the amplifier 1036. The noted circuit components 1032, 1036, 1037, and 1038 can be packaged into a common image sensor integrated circuit 1040. Image sensor integrated circuit 1040 can incorporate fewer than the noted number of components. In one example, image sensor array 1033 can be a hybrid monochrome and color image sensor array having a first subset of monochrome pixels without color filter elements and a second subset of color pixels having color sensitive filter elements. In one example, image sensor integrated circuit 1040 can incorporate a Bayer pattern filter, so that defined at the image sensor array 1033 are red pixels at red pixel positions, green pixels at green pixel positions, and blue pixels at blue pixel positions. Frames that are provided utilizing such an image sensor array incorporating a Bayer pattern can include red pixel values at red pixel positions, green pixel values at green pixel positions, and blue pixel values at blue pixel positions. In an embodiment incorporating a Bayer pattern image sensor array, CPU 1060 prior to subjecting a frame to further processing can interpolate pixel values at frame pixel positions intermediate of green pixel positions utilizing green pixel values for development of a monochrome frame of image data. Alternatively, CPU 1060 prior to subjecting a frame for further processing can interpolate pixel values intermediate of red pixel positions utilizing red pixel values for development of a monochrome frame of image data. CPU 1060 can alternatively, prior to subjecting a frame for further processing interpolate pixel values intermediate of blue pixel positions utilizing blue pixel values. An imaging subsystem of apparatus 1000 can include image sensor 1032 and a lens assembly 200 for focusing an image onto image sensor array 1033 of image sensor 1032.

In the course of operation of apparatus 1000, image signals can be read out of image sensor 1032, converted, and stored into a system memory such as RAM 1080. A memory 1085 of apparatus 1000 can include RAM 1080, a nonvolatile memory such as EPROM 1082 and a storage memory device 1084 such as may be provided by a flash memory or a hard drive memory. In one embodiment, apparatus 1000 can include CPU 1060 which can be adapted to read out image data stored in memory 1080 and subject such image data to various image processing algorithms. Apparatus 1000 can include a direct memory access unit (DMA) 1070 for routing image information read out from image sensor 1032 that has been subject to conversion to RAM 1080. In another embodiment, apparatus 1000 can employ a system bus providing for bus arbitration mechanism (e.g., a PCI bus) thus eliminating the need for a central DMA controller. A skilled artisan would appreciate that other embodiments of the system bus architecture and/or direct memory access components providing for efficient data transfer between the image sensor 1032 and RAM 1080 are within the scope and the spirit of the invention.

Referring to further aspects of apparatus 1000, imaging lens assembly 200 can be adapted for focusing an image of a decodable indicia 15 located within a field of view 1240 on a substrate, T, onto image sensor array 1033. A size in target space of a field of view 1240 of apparatus 1000 can be varied in a number of alternative ways. A size in target space of a field of view 1240 can be varied, e.g., by changing a terminal to target distance, changing an imaging lens assembly setting, changing a number of pixels of image sensor array 1033 that are subject to read out. Imaging light rays can be transmitted about imaging axis 25. Lens assembly 200 can be adapted to be capable of multiple focal lengths and multiple planes of optimum focus (best focus distances).

Apparatus 1000 can include an illumination subsystem 800 for illumination of target, T, and projection of an illumination pattern 1260. Illumination pattern 1260, in the embodiment shown can be projected to be proximate to but larger than an area defined by field of view 1240, but can also be projected in an area smaller than an area defined by a field of view 1240. Illumination subsystem 800 can include a light source bank 500, comprising one or more light sources. The apparatus 100 may be configured so that the light from light source bank 500 is directed toward a field of view 1240. Thus in various embodiments, light source bank 500 may be configured such that is affixed to the apparatus 1000, while in other embodiments light source bank 500 may be remote and direct light toward apparatus 1000 or field of view 1240.

A physical form view of an example of an illumination subsystem is shown in FIGS. 2-3. As shown in FIGS. 2-3, an imaging module 400 can be provided having a circuit board 402 carrying image sensor 1032 and lens assembly 200 disposed in support 430 disposed on circuit board 402. In the embodiment of FIGS. 2 and 3, illumination subsystem 800 has a light source bank 500 provided by single light source 502. Single light source 502 may be, for example purposes, an LED. In another embodiment, light source bank 500 can be provided by more than one light source 502 for example, more than one LED. Apparatus 1000 can be adapted so that light from each of a one or more light source 502 of light source bank 500 is directed toward field of view 1240 and utilized for projection of illumination pattern 1240. Referring again to FIG. 1, apparatus 1000 can also include an aiming subsystem 600 for projecting an aiming pattern 1242. Aiming subsystem 600 which can comprise a light source bank can be coupled to aiming light source bank power input unit 1208 for providing electrical power to a light source bank of aiming subsystem 600. The aiming light source bank may be, for example, one or more light source 602. Apparatus 1000 can be adapted so that light from one or more light source of aiming light source 600 is directed toward field of view 1240 and is utilized for projection of aiming pattern 1242. Power input unit 1208 can be coupled to system bus 1500 via interface 1108 for communication with CPU 1060.

In one embodiment, illumination subsystem 800 can include, in addition to light source bank 500, an illumination lens assembly 300, as is shown in the embodiment of FIG. 1. In addition to or in place of illumination lens assembly 300 illumination subsystem 800 can include alternative light shaping optics, e.g. one or more diffusers, mirrors and prisms. In use, apparatus 1000 can be oriented by an operator with respect to a target, T, (e.g., a piece of paper, a package, another type of substrate) bearing decodable indicia 15 in such manner that illumination pattern 1260 is projected on a decodable indicia 15. In the example of FIG. 1, decodable indicia 15 is provided by a 1D bar code symbol. Decodable indicia 15 could also be provided by a 2D bar code symbol or optical character recognition (OCR) characters. Referring to further aspects of apparatus 1000, lens assembly 200 can be controlled with use of electrical power input unit 1202 which provides energy for changing a plane of optimum focus of lens assembly 200. In one embodiment, an electrical power input unit 1202 can operate as a controlled voltage source, and in another embodiment, as a controlled current source. Electrical power input unit 1202 can apply signals for changing optical characteristics of lens assembly 200, e.g., for changing a focal length and/or a best focus distance of (a plane of optimum focus of) lens assembly 200. Light source bank electrical power input unit 1206 can provide energy to light source bank 500. In one embodiment, electrical power input unit 1206 can operate as a controlled voltage source. In another embodiment, electrical power input unit 1206 can operate as a controlled current source. In another embodiment electrical power input unit 1206 can operate as a combined controlled voltage and controlled current source. Electrical power input unit 1206 can change a level of electrical power provided to (energization level of) light source bank 500, e.g., for changing a level of illumination output by light source bank 500 of illumination subsystem 800 for generating illumination pattern 1260.

In another aspect, apparatus 1000 can include power supply 1402 that supplies power to a power grid 1404 to which electrical components of apparatus 1000 can be connected. Power supply 1402 can be coupled to various power sources, e.g., a battery 1406, a serial interface 1408 (e.g., USB, RS232), and/or AC/DC transformer 1410).

Further regarding power input unit 1206, power input unit 1206 can include a charging capacitor that is continually charged by power supply 1402. Power input unit 1206 can be configured to output energy within a range of energization levels. An average energization level of illumination subsystem 800 during exposure periods with the first illumination and exposure control configuration active can be higher than an average energization level of illumination and exposure control configuration active.

Apparatus 1000 can also include a number of peripheral devices including trigger 1220 which may be used to make active a trigger signal for activating frame readout and/or certain decoding processes. Apparatus 1000 can be adapted so that activation of trigger 1220 activates a trigger signal and initiates a decode attempt. Specifically, apparatus 1000 can be operative so that in response to activation of a trigger signal, a succession of frames can be captured by way of read out of image information from image sensor array 1033 (typically in the form of analog signals) and then storage of the image information after conversion into memory 1080 (which can buffer one or more of the succession of frames at a given time). CPU 1060 can be operative to subject one or more of the succession of frames to a decode attempt.

For attempting to decode a bar code symbol, e.g., a one dimensional bar code symbol, CPU 1060 can process image data of a frame corresponding to a line of pixel positions (e.g., a row, a column, or a diagonal set of pixel positions) to determine a spatial pattern of dark and light cells and can convert each light and dark cell pattern determined into a character or character string via table lookup. Where a decodable indicia representation is a 2D bar code symbology, a decode attempt can comprise the steps of locating a finder pattern using a feature detection algorithm, locating matrix lines intersecting the finder pattern according to a predetermined relationship with the finder pattern, determining a pattern of dark and light cells along the matrix lines, and converting each light pattern into a character or character string via table lookup. CPU 1060, which, as noted, can be operative in performing processing for attempting to decode decodable indicia, can be incorporated in an integrated circuit 2060 disposed on circuit board 402 (shown in FIGS. 2 and 3).

Apparatus 1000 can include various interface circuits for coupling various of the peripheral devices to system address/data bus (system bus) 1500, for communication with CPU 1060 also coupled to system bus 1500. Apparatus 1000 can include interface circuit 1028 for coupling image sensor timing and control circuit 1038 to system bus 1500, interface circuit 1102 for coupling electrical power input unit 1202 to system bus 1500, interface circuit 1106 for coupling illumination light source bank power input unit 1206 to system bus 1500, and interface circuit 1120 for coupling trigger 1220 to system bus 1500. Apparatus 1000 can also include a display 1222 coupled to system bus 1500 and in communication with CPU 1060, via interface 1122, as well as pointer mechanism 1224 in communication with CPU 1060 via interface 1124 connected to system bus 1500. Apparatus 1000 can also include range detector unit 1210 coupled to system bus 1500 via interface 1110. In one embodiment, range detector unit 1210 can be an acoustic range detector unit. Apparatus 1000 can also include a keyboard 1226 coupled to system bus 1500 via interface 1126. Various interface circuits of apparatus 1000 can share circuit components. For example, a common microcontroller can be established for providing control inputs to both image sensor timing and control circuit 1038 and to power input unit 1206. A common microcontroller providing control inputs to circuit 1038 and to power input unit 1206 can be provided to coordinate timing between image sensor array controls and illumination subsystem controls. Apparatus 1000 may include a network communication interface 1252 coupled to system bus 1500 and in communication with CPU 1060, via interface 1152. Network communication interface 1252 may be configured to communicate with an external computer through a network.

A succession of frames of image data that can be captured and subject to the described processing can be full frames (including pixel values corresponding to each pixel of image sensor array 1033 or a maximum number of pixels read out from image sensor array 1033 during operation of apparatus 1000). A succession of frames of image data that can be captured and subject to the described processing can also be "windowed frames" comprising pixel values corresponding to less than a full frame of pixels of image sensor array 1033. A succession of frames of image data that can be captured and subject to the described processing can also comprise a combination of full frames and windowed frames. A full frame can be read out for capture by selectively addressing pixels of image sensor 1032 having image sensor array 1033 corresponding to the full frame. A windowed frame can be read out for capture by selectively addressing pixels of image sensor 1032 having image sensor array 1033 corresponding to the windowed frame. In one embodiment, a number of pixels subject to addressing and read out determine a picture size of a frame. Accordingly, a full frame can be regarded as having a first relatively larger picture size and a windowed frame can be regarded as having a relatively smaller picture size relative to a picture size of a full frame. A picture size of a windowed frame can vary depending on the number of pixels subject to addressing and readout for capture of a windowed frame.

Apparatus 1000 can capture frames of image data at a rate known as a frame rate. A typical frame rate is 60 frames per second (FPS) which translates to a frame time (frame period) of 16.6 ms. Another typical frame rate is 30 frames per second (FPS) which translates to a frame time (frame period) of 33.3 ms per frame. A frame rate of apparatus 1000 can be increased (and frame time decreased) by decreasing of a frame picture size.

Figure 4:
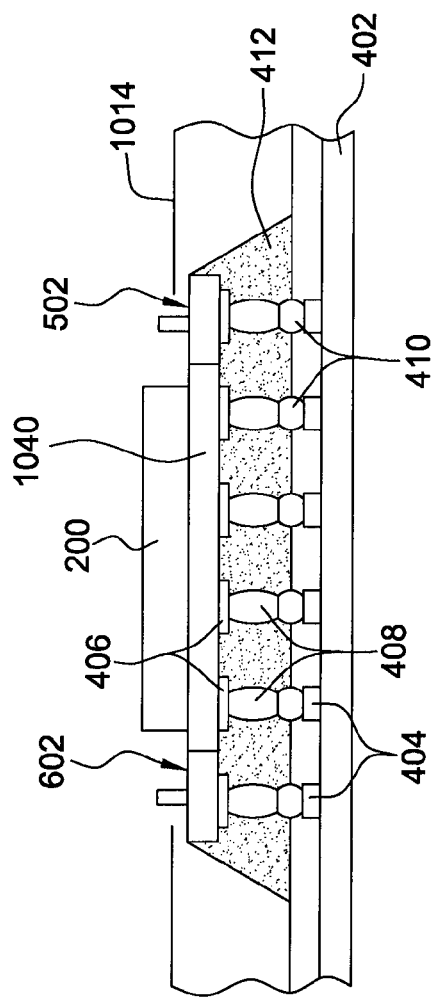
FIG. 4 is a side view of an apparatus for use in decoding a bar code symbol, in accordance with an aspect of the invention.

Referring now to FIG. 4, at least one contact pad 404 may be disposed on a surface of circuit board 402, which may be a printed circuit board. At least one electrode pad 406 may be disposed on a surface of image sensor integrated circuit 1040. At least one conductive projection 408 may extend away from image sensor integrated circuit 1040. As shown in FIG. 4, the at least one conductive projection 408, may be disposed upon the at least one electrode pad 406. At least one conductive adhesive connector 410 may be disposed between the at least one conductive projection 408 and at least one contact pad 404. In an alternative embodiment, the at least one conductive adhesive connector 410 may be positioned the at least one contact pad 404 and the at least one electrode pad 406. In at least one embodiment, the at least one conductive adhesive connector 410 may be comprised of solder; however, alternative suitable materials may be used. A material such as a resin or organic material 412 may be placed over and/or around image sensor integrated circuit 1040 to prevent damage and insure proper performance.

Still referring to FIG. 4, light source bank 500 may include one or more light source. One or more of the one or more light sources of bank 500 can be disposed on circuit board 402. In one embodiment, light source bank 500 may be comprised of a single light source 502. In still another embodiment a light source 502 or light source bank 500 may be comprised of a single LED. Light source bank 500 may be comprised or more than one light source 502, for example more than one LED. In addition, one or more light source 602 of aiming subsystem 600 may be disposed on circuit board 402. Aiming subsystem 600 may include a single aiming light source 602, which in one embodiment can be provided by an LED. Aiming subsystem 600 may include more than one light source, for example more than one LED.

Figure 5:
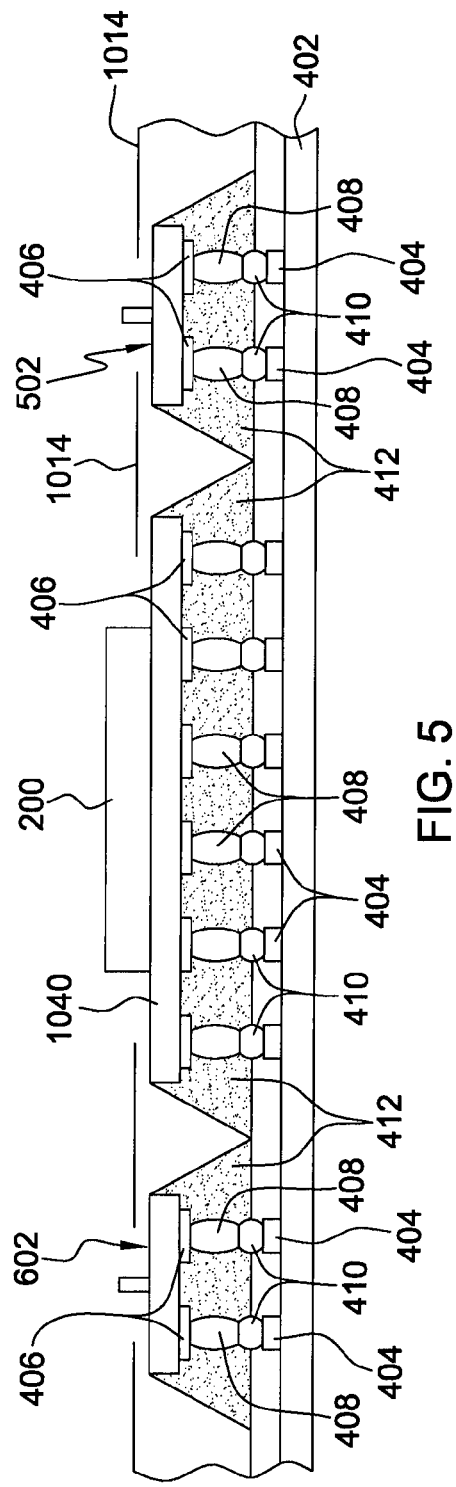
FIG. 5 is a side view of an apparatus for use in decoding a bar code symbol, in accordance with an aspect of the invention.

Referring now to FIG. 5, an alternative embodiment of an apparatus for use in decoding a bar code symbol is shown. In the embodiment shown in FIG. 5, image sensor integrated circuit 1040 is connected to circuit board 402 in generally the same manner as described above. Briefly, at least one electrode pad 406, formed on integrated circuit 402 may have at least one conductive projection 408 extending away from the image sensor integrated circuit. At least one contact pad 404 may be formed on circuit board 402, with at least one conductive adhesive connector 410 formed between the at least one contact pad 404 and either the at least one projection 408, at least one electrode pad 408, or both. A resin or organic material 412 may be disposed on or around image sensor integrated circuit 1040.

Still referring to FIG. 5, the apparatus for use in decoding a bar code symbol may also include a light source bank 500 to provide illumination. Light source bank 500 may be comprised of a single light source 502, which may be provided by an LED. Alternatively, light source bank 500 may include more than one light source 502, for example, more than one LED. One or more light source 502 or light source bank 500 may be disposed on the printed circuit board 402. One or more light source 502 or light source bank 500 may be electrically and mechanically connected to circuit board 402 in a manner similar to the connection of image sensor integrated circuit 1040 discussed above. Particularly, at least one electrode pad 406 may be disposed on light source bank 500, at least one conductive projection 408 may extend away from the at least one contact pad 404. At least one electrode pad may be formed on circuit board 402, at least one conductive adhesive connector 410 may be formed between the at least one contact pad 404 and the at least one conductive projection 408 and/or the at least electrode pad 406.

Also shown in FIG. 5, aiming subsystem 600 may include a single aiming light source 602, which may be provided by an LED. Alternatively, aiming subsystem 600 may include more than one light source 602, for example, more than one LED. One or more aiming light source 602 of the aiming subsystem 600 may be disposed on the circuit board 402 in a manner similar to light source 502 described above. At least one electrode pad 406 may be disposed on aiming subsystem 600 and at least one conductive projection 408 may extend away from aiming subsystem 600. Circuit board 402 may have at least one contact pad 404, where at least one conductive adhesive connector 410 is disposed between the at least one contact pad 404 and the at least one electrode pad 406 and/or at least one conductive projection 408.

Still referring to FIG. 5, the circuitry described above for the image sensor integrated circuit 1040, the light source bank 500, and the aiming subsystem 600, may be partially or wholly surrounded by a resin or organic material 412 to strengthen, protect and/or secure the electric and physical connection to the circuit board 402.

Referring to FIGS. 4 and 5, the elements as discussed above may be partially or wholly disposed within a housing 1014, which in one embodiment can be a hand held housing. In the embodiments described above the conductive adhesive connectors 410 may provide electrical input/output and mechanical connections between the printed circuit board 402 and the image sensor integrated circuit 1040, the light source bank 500 and/or the aimer subsystem 600. Also shown as shown in FIGS. 4 and 5, lens assembly 200 may be disposed on image sensor integrated circuit 1040. As shown in FIGS. 4 and 5, one or more light source 502 of light source bank 500 may be positioned on the printed circuit board to minimize light waste. More specifically, one or more light source 502 of light source bank 500 may extend approximately the same distance away from the printed circuit board 402 as lens assembly 200. In alternative embodiments, one or more light source 502 of the light source bank 500 may extend further away from circuit board 400 than lens assembly 200. Apparatus 1000 can be adapted so that light produced by each of a one or more light source of light source bank 500 may be utilized for projection of an illumination pattern 1260 for illumination of a field of view 1240 (shown in FIG. 1) or in a manner sufficient for decodable indicia to be read. In a similar manner, one or more light source 602 of aimer subsystem 600 may similarly be positioned on printed circuit board 402 in order to minimize light waste. In one embodiment, aimer subsystem 600 extends substantially the same distance away from the printed circuit board 402 as lens assembly 200. However, in other embodiments the relative distance of the lens assembly 200 and aimer subsystem 600 may be adjusted relative to one another to reach a suitable configuration.

Figure 6:
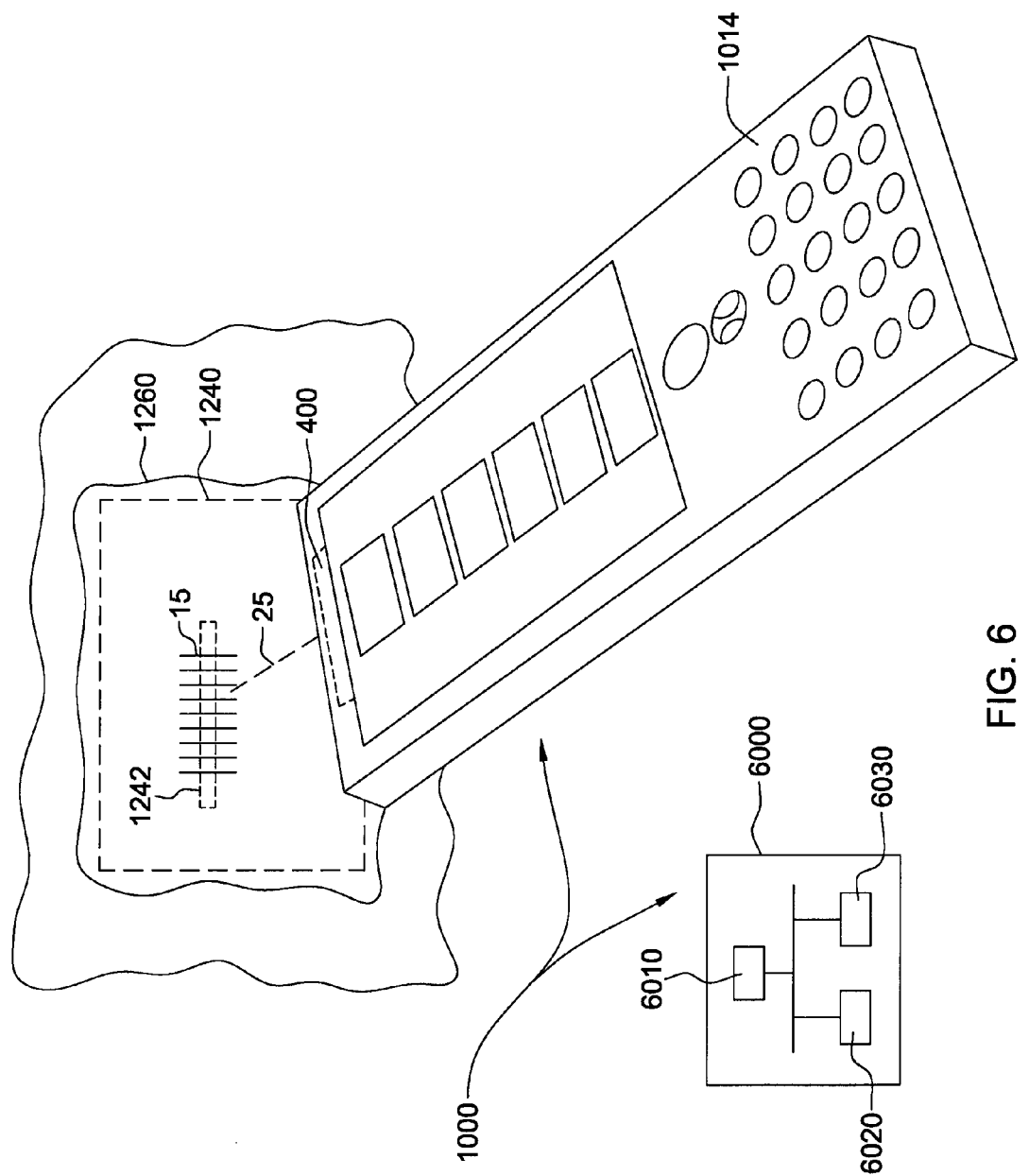
FIG. 6 is a perspective view of an apparatus for use in decoding a bar code symbol, in accordance with an aspect of the invention.

Referring Now to FIG. 6, an example apparatus is shown 1000 is shown. Specifically, apparatus 1000 may have a housing 1014, which as shown in FIG. 6, may be a hand held housing. Housing 1014 is configured to encapsulate image sensor integrated circuit 1040 (shown in FIG. 4). A microprocessor integrated circuit 2060 having a CPU for attempting to decode decodable indicia can be disposed on circuit board 402 (shown in FIG. 4). Such microprocessor integrated circuit 2060 may be disposed externally to circuit board 402, for example, on a circuit board external to circuit board 402 within housing 1014. In another embodiment, apparatus 1000 may include CPU 1060, memory 1085, and network communication interface 1252 comprising a first computer housed within housing 1014 (shown in FIG. 1), and a second computer 6000 external to housing 1014, having a CPU 6010, memory 6020 and a network communication interface 6030. Image data can be transmitted to the second computer 6000 for processing by the CPU 6010 for attempting to decode decodable indicia.

A small sample of systems methods and apparatus that are described herein is as follows:

A1. An apparatus for use in decoding a bar code symbol, the apparatus comprising:
an image sensor integrated circuit, the image sensor integrated circuit having a plurality of pixels arranged in a plurality of rows and columns of pixels, timing and control circuitry for controlling an image sensor, gain circuitry for controlling the gain of one or more signals, analog to digital conversion circuitry for conversion of an analog signal to a digital signal, and a plurality of electrode pads on a surface of the image sensor integrated circuit;
a printed circuit board receiving the image sensor integrated circuit, the printed circuit board having a plurality of contact pads disposed on a surface of the printed circuit board; and
wherein a connection between said image sensor integrated circuit and said printed circuit board is characterized by a plurality of conductive adhesive connectors disposed between the plurality of electrode pads on the surface of the image sensor integrated circuit and the plurality of contact pads disposed on a surface of the printed circuit board, the conductive adhesive connectors providing electrical input/output and mechanical connections between said image sensor integrated circuit and said printed circuit board.

A2. The apparatus of A1, wherein the apparatus is operative for processing of image signals generated by the image sensor integrated circuit for attempting to decode the bar code symbol.

A3. The apparatus of A1, further comprising a hand held housing encapsulating the image sensor integrated circuit.

A4. The apparatus of A3, wherein the processing of image signals generated by the image sensor integrated circuit for attempting to decode the bar code symbol is performed within the housing.

A5. The apparatus of A3, wherein the processing of image signals generated by the image sensor integrated circuit for attempting to decode the bar code symbol is performed by circuitry external to the housing.

A6. The apparatus of A1, wherein the processing of image signals generated by the image sensor integrated circuit for attempting to decode the bar code symbol is performed by a circuit disposed on said printed circuit board.

A7. The apparatus of A1, wherein the processing of image signals generated by the image sensor integrated circuit for attempting to decode the bar code symbol is performed by a computer external to the housing.

A8. The apparatus of A1 further comprising a light source bank positioned on said printed circuit board.

A9. The apparatus of A8 wherein the light source bank is an LED.

A10. The apparatus of A1 further comprising a light source bank and a light circuitry for controlling the operation of the light source bank, the light source bank electrically connected to the light circuitry, and the light circuitry electrically connected to said printed circuit board.

A11. The apparatus of A1 further comprising an aimer light source bank positioned on said printed circuit board.

A12. The apparatus of A11 wherein the aimer source bank is an LED.

A13. The apparatus of A1 further comprising an aimer subsystem and an aimer light circuitry for controlling the operation of an aimer light bank, the aimer light bank electrically connected to the aimer light circuitry, and the aimer light circuitry electrically connected to said printed circuit board.

While the present invention has been described with reference to a number of specific embodiments, it will be understood that the true spirit and scope of the invention should be determined only with respect to claims that can be supported by the present specification. Further, while in numerous cases herein wherein systems and apparatuses and methods are described as having a certain number of elements it will be understood that such systems, apparatuses and methods can be practiced with fewer than or greater than the mentioned certain number of elements. Also, while a number of particular embodiments have been described, it will be understood that features and aspects that have been described with reference to each particular embodiment can be used with each remaining particularly described embodiment.

The invention claimed is:

1. An apparatus for use in decoding a bar code symbol, the apparatus comprising:
an image sensor integrated circuit, the image sensor integrated circuit having an image sensor including a plurality of pixels arranged in a plurality of rows and columns of pixels, timing and control circuitry for controlling the image sensor, gain circuitry for controlling the gain of one or more signals, analog to digital conversion circuitry for conversion of an analog signal to a digital signal, and a plurality of electrode pads on a surface of the image sensor integrated circuit;
a printed circuit board receiving the image sensor integrated circuit, the printed circuit board having a plurality of contact pads disposed on a surface of the printed circuit board;
wherein a connection between said image sensor integrated circuit and said printed circuit board is characterized by a plurality of conductive adhesive connectors disposed between the plurality of electrode pads on the surface of the image sensor integrated circuit and the plurality of contact pads disposed on a surface of the printed circuit board, the conductive adhesive connectors providing electrical input/output and mechanical connections between said image sensor integrated circuit and said printed circuit board;
wherein the apparatus is operative for processing of image signals generated by the image sensor integrated circuit for attempting to decode the bar code symbol; and
a light source positioned on said printed circuit board, the apparatus being adapted to direct light from the light source toward a field of view of the apparatus, wherein the light source is connected to the printed circuit board by an adhesive conductive connector disposed between at least one contact pad disposed on a surface of the printed circuit board and at least one conductive projection extending away from an at least one electrode pad formed on the light source.

2. The apparatus of claim 1, further comprising a hand held housing encapsulating the image sensor integrated circuit.

3. The apparatus of claim 2, wherein the processing of image signals generated by the image sensor integrated circuit for attempting to decode the bar code symbol is performed within the housing.

4. The apparatus of claim 2, wherein the processing of image signals generated by the image sensor integrated circuit for attempting to decode the bar code symbol is performed by circuitry external to the housing.

5. The apparatus of claim 1, wherein the processing of image signals generated by the image sensor integrated circuit for attempting to decode the bar code symbol is performed by a circuit disposed on said printed circuit board.

6. The apparatus of claim 2, wherein the processing of image signals generated by the image sensor integrated circuit for attempting to decode the bar code symbol is performed by a computer external to the housing.

7. The apparatus of claim 1 wherein the light source is an LED.

8. The apparatus of claim 1 further comprising a light circuitry for controlling the operation of the light source, the light source electrically connected to the light circuitry, and the light circuitry disposed on said printed circuit board.

9. The apparatus of claim 1, wherein the light source is a light source of an illuminating subsystem that projects an illumination pattern.

10. The apparatus of claim 1, wherein the light source is a light source of an aiming subsystem for use in projecting an aiming pattern.

11. The apparatus of claim 1 further comprising an aimer light source positioned on said printed circuit board, the apparatus being adapted to direct light from the aimer light source toward a field of view of the apparatus.

12. An apparatus for use in decoding a bar code symbol, the apparatus comprising:
- an image sensor integrated circuit, the image sensor integrated circuit having an image sensor including a plurality of pixels arranged in a plurality of rows and columns of pixels, timing and control circuitry for controlling the image sensor, gain circuitry for controlling the gain of one or more signals, analog to digital conversion circuitry for conversion of an analog signal to a digital signal, and a plurality of electrode pads on a surface of the image sensor integrated circuit;
- a printed circuit board receiving the image sensor integrated circuit, the printed circuit board having a plurality of contact pads disposed on a surface of the printed circuit board;
- wherein a connection between said image sensor integrated circuit and said printed circuit board is characterized by a plurality of conductive adhesive connectors disposed between the plurality of electrode pads on the surface of the image sensor integrated circuit and the plurality of contact pads disposed on a surface of the printed circuit board, the conductive adhesive connectors providing electrical input/output and mechanical connections between said image sensor integrated circuit and said printed circuit board;
- wherein the apparatus is operative for processing of image signals generated by the image sensor integrated circuit for attempting to decode the bar code symbol; and
- a first light source of an illumination subsystem and a second light source of an aiming subsystem positioned on said printed circuit board, the apparatus being adapted to direct light from the first light source and the second light source toward a field of view of the apparatus, wherein the first light source and the second light source are connected to the printed circuit board by an adhesive conductive connector disposed between at least one contact pad disposed on a surface of the printed circuit board and at least one conductive projection extending away from an at least one electrode pad formed on the first light source and the second light source.

13. The apparatus of claim 12, wherein the first light source and the second light source are provided by LEDs.

14. The apparatus of claim 12, wherein the processing of image signals generated by the image sensor integrated circuit for attempting to decode the bar code symbol is performed by a circuit disposed on said printed circuit board.

15. The apparatus of claim 12, comprising a hand held housing encapsulating the image sensor integrated circuit.

16. The apparatus of claim 15, wherein the processing of image signals generated by the image sensor integrated circuit for attempting to decode the bar code symbol is performed within the housing.

17. The apparatus of claim 15, wherein the processing of image signals generated by the image sensor integrated circuit for attempting to decode the bar code symbol is performed by circuitry external to the housing.

18. The apparatus of claim 15, wherein the processing of image signals generated by the image sensor integrated circuit for attempting to decode the bar code symbol is performed by a computer external to the housing.

19. The apparatus of claim 12, wherein the first light source projects an illumination pattern.

20. The apparatus of claim 12, wherein the second light source projects an aiming pattern.

* * * * *